United States Patent
Oh et al.

(10) Patent No.: US 10,791,291 B2
(45) Date of Patent: Sep. 29, 2020

(54) PIXEL CIRCUIT

(71) Applicant: Himax Imaging Limited, Tainan (TW)

(72) Inventors: Hack soo Oh, Tainan (TW); Yu Hin Desmond Cheung, Tainan (TW); Kihong Kim, Tainan (TW)

(73) Assignee: Himax Imaging Limited, Tainan (TW)

( * ) Notice: Subject to any disclaimer, the term of this patent is extended or adjusted under 35 U.S.C. 154(b) by 67 days.

(21) Appl. No.: 16/191,398

(22) Filed: Nov. 14, 2018

(65) Prior Publication Data

US 2020/0077041 A1    Mar. 5, 2020

Related U.S. Application Data

(60) Provisional application No. 62/724,042, filed on Aug. 29, 2018.

(51) Int. Cl.
*H04N 5/3745* (2011.01)
*H04N 5/378* (2011.01)
*H01L 27/146* (2006.01)
*H04N 5/353* (2011.01)

(52) U.S. Cl.
CPC ......... *H04N 5/37452* (2013.01); *H04N 5/378* (2013.01); *H01L 27/14641* (2013.01); *H04N 5/353* (2013.01)

(58) Field of Classification Search
CPC .... H04N 5/37452; H04N 5/378; H04N 5/353; H01L 27/14641
See application file for complete search history.

(56) References Cited

U.S. PATENT DOCUMENTS

| | | | |
|---|---|---|---|
| 7,224,389 B2 | 5/2007 | Dierickx | |
| 9,728,578 B2 | 8/2017 | Storm | |
| 9,967,504 B1 | 5/2018 | Manabe | |
| 2003/0011694 A1 | 1/2003 | Dierickx | |
| 2015/0130977 A1* | 5/2015 | Ladd | H04N 5/378 348/308 |
| 2015/0208009 A1 | 7/2015 | Oh | |
| 2016/0150175 A1* | 5/2016 | Hynecek | H04N 5/363 250/208.1 |

(Continued)

FOREIGN PATENT DOCUMENTS

| | | |
|---|---|---|
| TW | 201120709 A1 | 6/2011 |
| TW | I433537 B | 4/2014 |

(Continued)

*Primary Examiner* — Mekonnen D Dagnew
(74) *Attorney, Agent, or Firm* — Winston Hsu

(57) ABSTRACT

A pixel circuit includes a front-end circuit, a signal storage circuit, and an output circuit. The signal storage circuit is coupled to the front-end circuit, and the output circuit is coupled to the signal storage circuit. The front-end circuit is arranged to generate pixel signals. The signal storage circuit is arranged to store the pixel signals generated by the front-end circuit, wherein when the pixel circuit is selected for performing a read-out operation, the pixel signals stored in the signal storage circuit are pulled up from original voltage levels to other voltage levels higher than the original voltage levels according to a voltage increment applied to a control voltage. When the pixel circuit is selected for performing the read-out operation, the output circuit generates output signals on an output terminal according to the other voltage levels, respectively.

6 Claims, 7 Drawing Sheets

(56) References Cited

U.S. PATENT DOCUMENTS

| | | | |
|---|---|---|---|
| 2017/0323912 A1* | 11/2017 | Lahav | H01L 27/14623 |
| 2018/0033809 A1 | 2/2018 | Tayanaka | |
| 2018/0063459 A1* | 3/2018 | Stark | H01L 27/14643 |
| 2018/0240837 A1 | 8/2018 | Chen | |
| 2018/0295303 A1 | 10/2018 | Murao | |
| 2018/0332247 A1 | 11/2018 | Do | |
| 2019/0181171 A1 | 6/2019 | Tadmor | |
| 2020/0092505 A1 | 3/2020 | Sano | |

FOREIGN PATENT DOCUMENTS

| | | |
|---|---|---|
| TW | I573463 B | 3/2017 |
| TW | 201719874 A | 6/2017 |
| TW | 201729410 A | 8/2017 |

\* cited by examiner

PIXEL CIRCUIT

CROSS REFERENCE TO RELATED APPLICATIONS

This application claims the benefit of U.S. provisional application No. 62/724,042, which was filed on Aug. 29, 2018, and is included herein by reference.

BACKGROUND OF THE INVENTION

1. Field of the Invention

The present invention is related to electronic circuits, and more particularly, to a pixel circuit.

2. Description of the Prior Art

Regarding architecture of a pixel circuit in the related art, such as that of a global-shutter pixel circuit in the related art, one or more source follower circuits may be utilized to buffer pixel signals. However, available output voltage range may be depressed due to a voltage difference between a gate terminal and a source terminal of an input transistor within a source follower. Thus, there is a need for a novel architecture to compensate the aforementioned available output voltage range.

SUMMARY OF THE INVENTION

An objective of the present invention is to provide a pixel circuit, in order to solve the related art problems without introducing any side effect or in a way that is less likely to introduce a side effect.

At least one embodiment of the present invention provides a pixel circuit, where the pixel circuit may comprise a front-end circuit, a signal storage circuit and an output circuit. The signal storage circuit is coupled to the front-end circuit, and the output circuit is coupled to the signal storage circuit. The front-end circuit is arranged to generate pixel signals, wherein the pixel signals comprise a photodiode signal and a reference signal. The signal storage circuit is arranged to store the photodiode signal and the reference signal generated by the front-end circuit, wherein when the pixel circuit is selected for performing a read-out operation, the photodiode signal and the reference signal stored in the signal storage circuit are pulled up from original voltage levels to other voltage levels higher than the original voltage levels according to a voltage increment applied to a control voltage. In addition, when the pixel circuit is selected for performing the read-out operation, the output circuit generates output signals on an output terminal according to the other voltage levels, respectively.

At least one embodiment of the present invention provides a pixel circuit, where the pixel circuit may comprise a front-end circuit, a signal storage circuit and an output circuit, and all of the front-end circuit, the signal storage circuit and the output circuit are coupled to a common floating diffusion (FD) node. The front-end circuit is arranged to generate pixel signals, wherein the pixel signals comprises a photodiode signal and a reference signal. The signal storage circuit is arranged to store the photodiode signal and the reference signal generated by the front-end circuit, wherein when the pixel circuit is selected for performing a read-out operation, the photodiode signal and the reference signal stored in the signal storage circuit are pulled up from original voltage levels to other voltage levels higher than the original voltage levels according to a voltage increment applied to a control voltage of the signal storage circuit. In addition, when the pixel circuit is selected for performing the read-out operation, the output circuit generates output signals on an output terminal according to voltage levels of the common FD node, respectively.

The present invention pixel circuit can pull up the pixel signals stored in the signal storage circuit when the pixel signal is being read out. Therefore, depressed output voltage range due to source follower(s) can be compensated.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
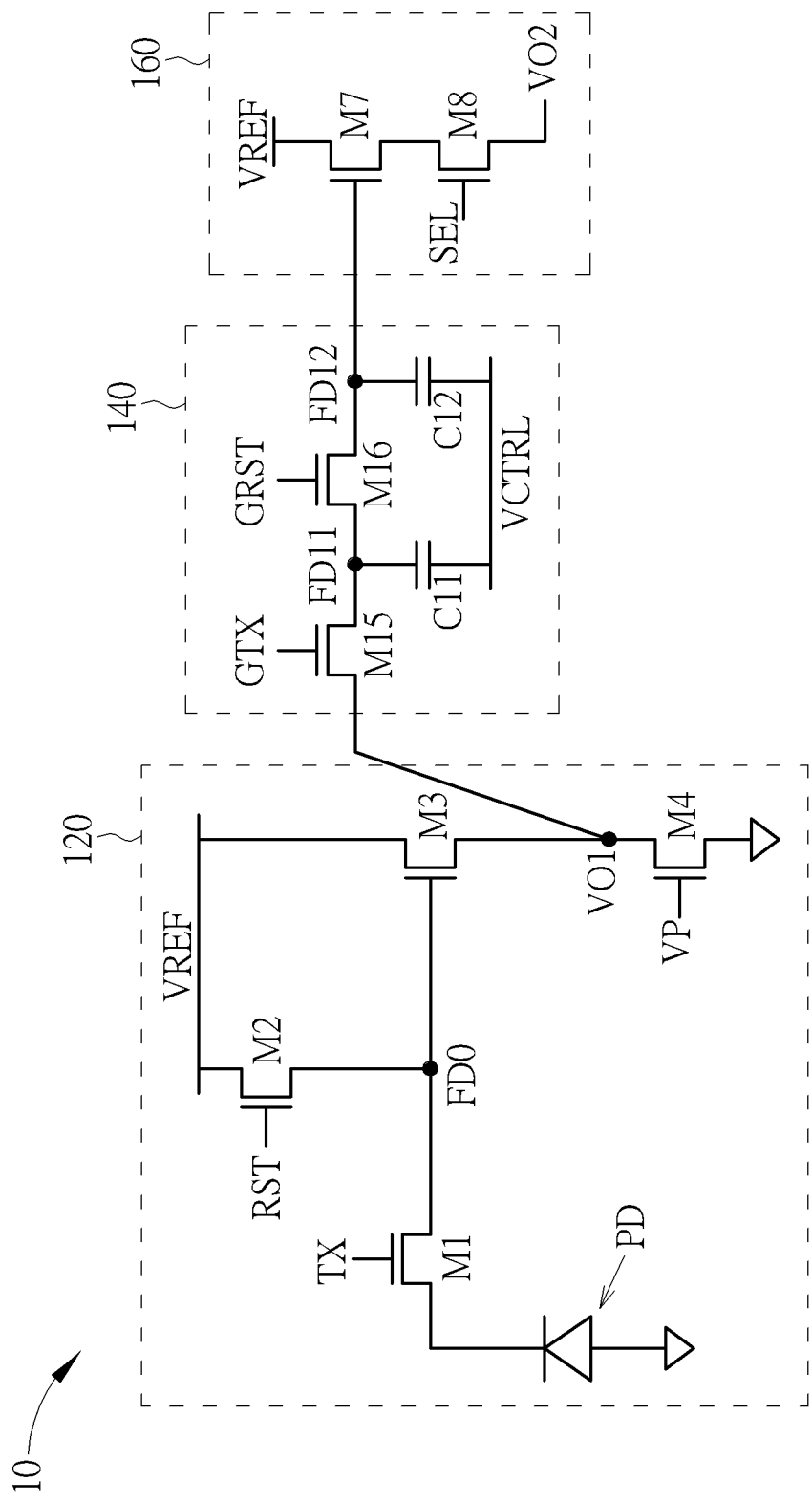
FIG. 1 is a diagram illustrating a pixel circuit according to an embodiment of the present invention.

FIG. 1 is a diagram illustrating a pixel circuit 10 according to an embodiment of the present invention, where the pixel circuit 10 is applicable to a pixel unit in a global-shutter image sensor, such as one of a plurality of pixel units in the global-shutter image sensor, but the present invention is not limited thereto. As shown in FIG. 1, the pixel circuit 10 may comprise a front-end circuit 120, a signal storage circuit 140 and an output circuit 160. The signal storage circuit 140 is coupled to the front-end circuit 120, and the output circuit is coupled to the signal storage circuit 140. The front-end circuit 120 may generate pixel signals, where the pixel signals may comprise a photodiode signal and a reference signal. The signal storage circuit 140 may store the photodiode signal and the reference signal generated by the front-end circuit 120. The output circuit 160 may generate output signals on an output terminal of the output circuit 160 according to voltage levels on an input terminal (which is coupled to the signal storage circuit 140) of the output circuit 160.

According to this embodiment, the front-end circuit 120 may comprise a photodiode PD and a plurality of transistor such as transistors M1, M2, M3 and M4. The photodiode PD may accumulate charges in response to incident radiation, to generate the photodiode signal. The transistor M1 is coupled between the photodiode PD and a floating diffusion (FD) node FD0, where a gate terminal of the transistor M1 is coupled to a control signal TX. The transistor M2 is coupled between a first reference voltage (such as a reference voltage VREF) and the FD node FD0, where a gate terminal of the transistor M2 is coupled to a control signal RST. A gate terminal, a drain terminal and a source terminal of the transistor M3 are coupled to the FD node FD0, the reference voltage VREF and an output terminal VO1, respectively, where the output terminal VO1 is coupled to the signal storage circuit 140. The transistor M4 is coupled between the source terminal of the third transistor (i.e. the output terminal VO1) and a second reference voltage (such as a ground voltage), wherein a gate terminal of the transistor M4 is coupled to a control voltage VP.

According to this embodiment, the signal storage circuit 140 may comprise a plurality of transistors such as transistors M15 and M16 and a plurality of capacitors such as capacitors C11 and C12. The transistor M15 is coupled between the front-end circuit 120 (more particularly, the output terminal VO1) and an FD node FD11, where a gate terminal of the transistor M15 is coupled to a control signal GTX. The transistor M16 is coupled between the FD node FD11 and an FD node FD12, where a gate terminal of the transistor M16 is coupled to a control signal GRST. The capacitor C11 is coupled between the FD node FD11 and a control voltage VCTRL. The capacitor C12 is coupled between the FD node FD12 and the control voltage VCTRL. In this embodiment, the FD node FD11 and the FD node FD12 may store the photodiode signal and the reference signal, respectively.

According to this embodiment, the output circuit 160 may comprise a plurality of transistors such as transistors M7 and M8. A gate terminal and a drain terminal of the transistor M7 are coupled to the signal storage circuit 140 (more particularly, to the FD node FD12) and the reference voltage VREF, respectively. The transistor M8 is coupled between a source terminal of the transistor M7 and the output terminal of the buffer circuit (such as an output terminal VO2), where a gate terminal of the transistor M8 is coupled to a control signal SEL. It should be noted that there may be a transistor (not shown) coupled between the output terminal VO2 and the ground voltage, in order to provide the output circuit 160 with a bias current, but the present invention is not limited thereto.

Figure 2:
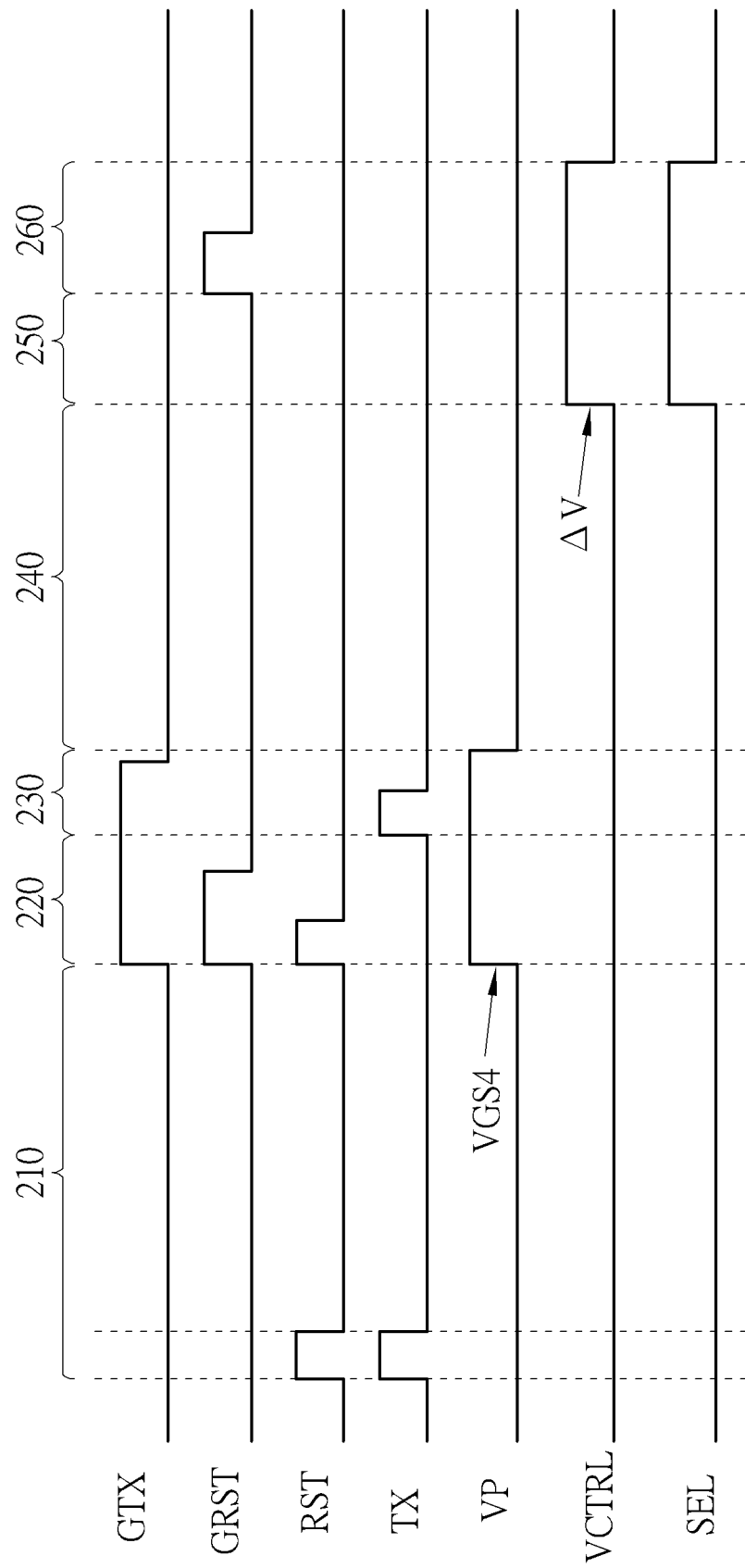
FIG. 2 is a timing diagram illustrating control signals and control voltages shown in FIG. 1 according to an embodiment of the present invention.

FIG. 2 is a timing diagram illustrating the control signals GTX, GRST, RST, TX and SEL and the control voltages VP and VCTRL shown in FIG. 1 according to an embodiment of the present invention. The timing diagram shown in FIG. 2 is for illustrative purposes only, and is not meant to be a limitation of the present invention. It should be noted that a low (logic low) state of a specific control signal within the control signals GTX, GRST, RST, TX and SEL may indicate a low voltage level (e.g. a voltage level of the ground voltage), and a high (e.g. logic high) state of this specific control signal may indicate a high voltage level (e.g. a voltage level of the reference voltage VREF); additionally, a low state of a specific control voltage within the control voltages VP and VCTRL may indicate the low voltage level (e.g. the voltage level of the ground voltage), and a high state of this specific control voltage may indicate a specific voltage level, but the present invention is not limited thereto.

Please refer to FIG. 2 in conjunction with FIG. 1. During a phase 210, when the control signals RST and TX are high and the control signals GTX and GRST are low, the photodiode PD (i.e. a node between the photodiode PD and the transistor M1) and the FD node FD0 may be reset to a reference voltage level, concurrently, and when the control signals RST and TX turn to low, the photodiode PD may start to accumulate charges in response to incident radiation (e.g. exposure while taking a photo) to generate the photodiode signal (e.g. image data) on the node between the photodiode PD and the transistor M1. During phases 220 and 230, the transistor M3 and M4 may operate as a source follower within the front-end circuit 120 since the control voltage VP is pulled up to a voltage level VGS4 from a ground voltage level. During the phase 220, when the control signals GTX, GRST and RST are high and the control signal TX is low, the reference signal may be transmitted to the output terminal VO1 through the transistor M2 and the source follower, to reset voltage levels of the FD nodes FD11 and FD12, and when the control signal GRST turns to low, the reference signal may be stored on the FD node FD12. During a phase 230, when the control signals GTX and TX are high and the control signals GRST and RST are low, the photodiode signal may be transmitted to the output terminal and the FD node FD11 through the transistor M1, the source follower and the transistor M15, and when the control signal GTX turns to low, the photodiode signal may be stored on the FD node FD11. During a phase 240, the pixel circuit 10 is waiting for being selected to perform a read out operation. During phases 250 and 260, the control signal SEL turns to high, which indicates the pixel circuit 10 is selected for performing the readout operation. During the phase 250, the output circuit 160 may generate a reference output signal on the output terminal VO2 according to a first voltage level (which may represent the reference signal) of the FD node FD12. During the phase 260, when the control signal GRST is high and the control signal GTX is low, the photodiode signal stored on the FD node FD11 may be transmitted to the FD node FD12, and therefore the output circuit 160 may generate a photodiode output signal on the output terminal VO2 according to a second voltage level (which may represent the photodiode signal) of the FD node FD12.

It should be noted that the photodiode signal and the reference signal stored in the signal storage circuit 140 (i.e. the FD nodes FD11 and FD12) are pulled up from original voltage levels to other voltage levels higher than the original voltage levels according to a voltage increment ΔV applied to the control voltage VCTRL. If the architecture did not perform this operation, available output voltage range might be depressed due to voltage drops respectively introduced by the transistor M3 and M7. More particularly, the voltage increment ΔV should be greater than a threshold voltage (i.e. a turn on voltage) of the transistor M7 (or the transistor M3), to ensure that the transistor M7 may be tuned on. For example, the voltage increment ΔV may be equal to a voltage difference between the gate terminal and the source terminal of the transistor M3, in order to compensate the voltage drop introduced by the transistor M3. For another example, the voltage increment ΔV may be equal to a voltage difference between the gate terminal and the source terminal of the transistor M7, in order to compensate the voltage drop introduced by the transistor M7.

Figure 3:
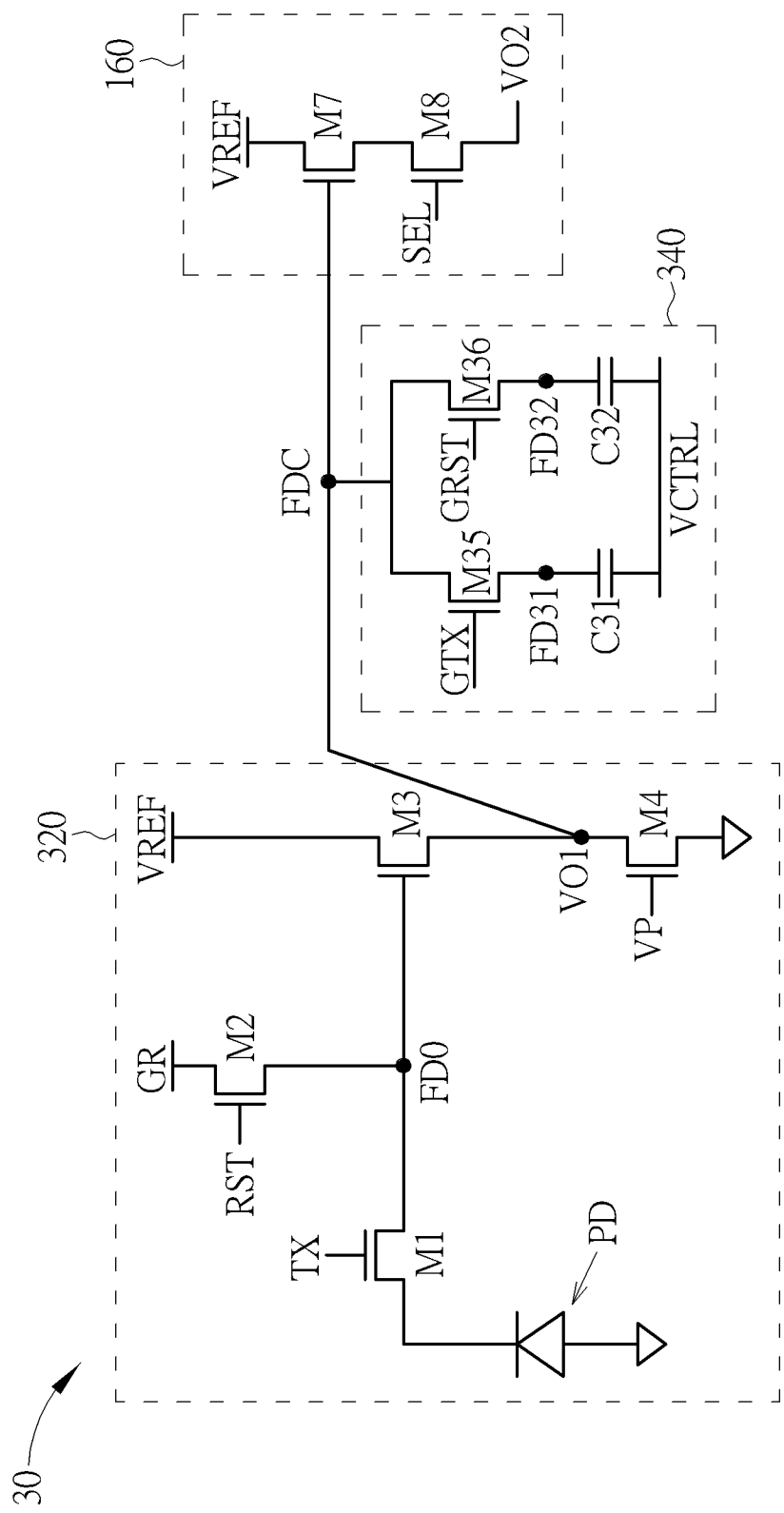
FIG. 3 is a diagram illustrating a pixel circuit according to an embodiment of the present invention.

FIG. 3 is a diagram illustrating a pixel circuit 30 according to an embodiment of the present invention, where the pixel circuit 30 is applicable to the pixel unit in the global-shutter image sensor, but the present invention is not limited thereto. As shown in FIG. 3, the pixel circuit 30 may comprise a front-end circuit 320, a signal storage circuit 340 and the output circuit 160. All of the front-end circuit 320, the signal storage circuit 340 and the output circuit 160 are coupled to a common FD node such as an FD node FDC. The front-end circuit 320 may generate pixel signals, where the pixel signals may comprise a photodiode signal and a reference signal. The signal storage circuit 340 may store the photodiode signal and the reference signal generated by the front-end circuit 320. For brevity, repeated descriptions regarding the output circuit 160 are omitted.

According to this embodiment, architecture of the front-end circuit 320 is similar to the front-end circuit 120 shown in FIG. 1. More particularly, the main difference between the front-end circuit 320 and the front-end circuit 120 is that the transistor M2 within the front-end circuit 320 is coupled between a control signal and the FD node FD0, rather than coupled between the reference voltage VREF and the FD node FD0. Additionally, the output terminal VO1 is coupled to the FD node FDC.

According to this embodiment, the signal storage circuit 340 may comprise a plurality of transistors such as transistors M35 and M36 and a plurality of capacitors such as capacitors C31 and C32. The transistor M15 is coupled between the FD node FDC and an FD node FD31, where a gate terminal of the transistor M35 is coupled to the control signal GTX. The transistor M36 is coupled between the FD node FDC and an FD node FD32, where a gate terminal of the transistor M36 is coupled to a control signal GRST. The capacitor C31 is coupled between the FD node FD31 and the control voltage VCTRL. The capacitor C32 is coupled between the FD node FD32 and the control voltage VCTRL. In this embodiment, one of the FD nodes FD31 and FD32 may store the photodiode signal, and another one of the FD nodes FD31 and FD32 may store the reference signal, but the present invention is not limited thereto. For example, the FD nodes FD31 and FD32 may store the reference signal and the photodiode signal, respectively. For another example, the FD nodes FD31 and FD32 may store the photodiode signal and the reference signal, respectively.

Figure 4:
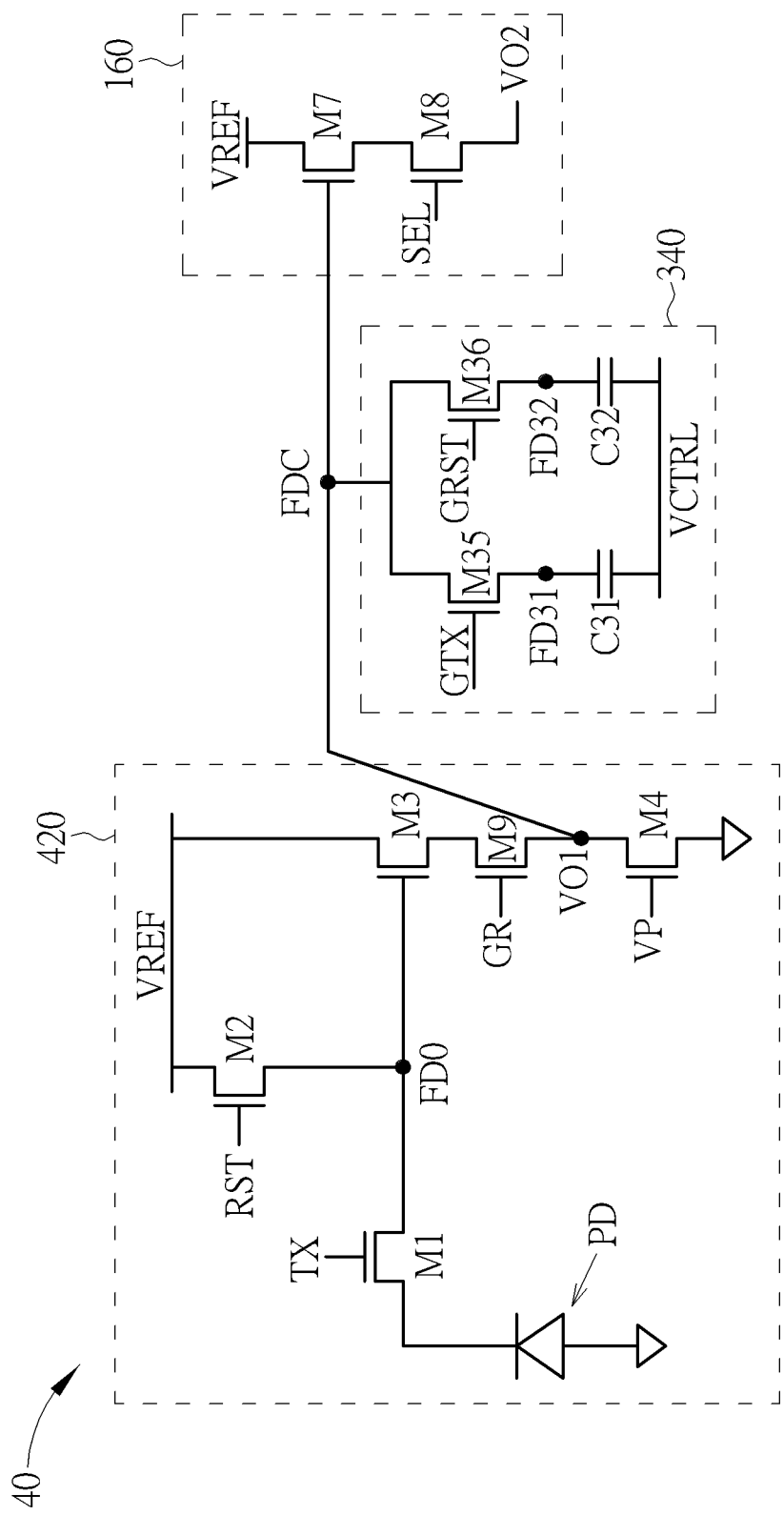
FIG. 4 is a diagram illustrating a pixel circuit according to an embodiment of the present invention.

FIG. 4 is a diagram illustrating a pixel circuit 40 according to an embodiment of the present invention, where the pixel circuit 40 is applicable to the pixel unit in the global-shutter image sensor, but the present invention is not limited thereto. The pixel circuit 40 is similar to the pixel circuit 30 in FIG. 3. The main difference between the pixel circuit 30 in FIG. 3 and the pixel circuit 40 is the change in architecture of the front-end circuit therein, for example, the front-end circuit 320 in FIG. 3 may be replaced by a front-end circuit 420 in this embodiment.

According to this embodiment, architecture of the front-end circuit 420 is similar to the front-end circuit 320 shown in FIG. 3. More particularly, one of differences between the front-end circuit 420 and the front-end circuit 320 is that the transistor M2 within the front-end circuit 420 is coupled between the reference voltage VREF and the FD node FD0, rather than coupled between the control signal GR and the FD node FD0. Another one of the differences between the front-end circuit 420 and the front-end circuit 320 is that an additional transistor such as a transistor M9 is coupled between the source terminal of the transistor M3 and the output terminal VO1, and a gate terminal of the transistor M9 is coupled to the control signal GR.

Figure 5:
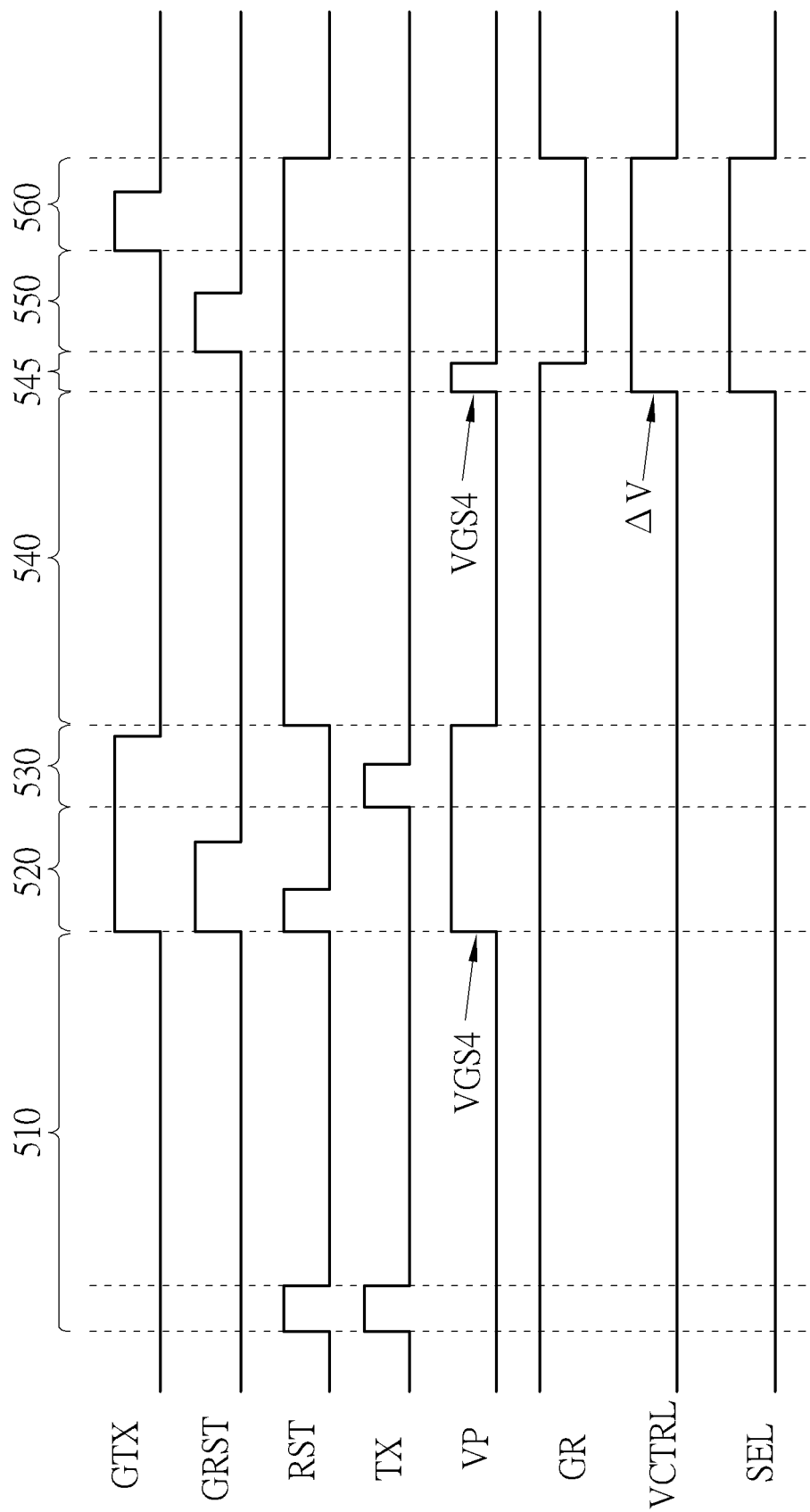
FIG. 5 is a timing diagram illustrating control signals and control voltages shown in FIG. 3 and FIG. 4 according to an embodiment of the present invention.

FIG. 5 is a timing diagram illustrating the control signals GTX, GRST, RST, TX, GR and SEL and the control voltages VP and VCTRL shown in any (e.g. each) of FIG. 3 and FIG. 4 according to an embodiment of the present invention. The timing diagram shown in FIG. 5 is for illustrative purposes only, and is not meant to be a limitation of the present invention. It should be noted that a low (logic low) state of a specific control signal within the control signals GTX, GRST, RST, TX, GR and SEL may indicate a low voltage level (e.g. a voltage level of the ground voltage), and a high (e.g. logic high) state of this specific control signal may indicate a high voltage level (e.g. a voltage level of the reference voltage VREF); additionally, a low state of a specific control voltage within the control voltages VP and VCTRL may indicate the low voltage level (e.g. the voltage level of the ground voltage), and a high state of this specific control voltage may indicate a specific voltage level, but the present invention is not limited thereto.

Please refer to FIG. 5 in conjunction with FIG. 3. As operations of a phase 510 are similar to that of the phase 210 shown in FIG. 2, similar descriptions are omitted, for brevity. During phases 520 and 530, the transistor M3 and M4 may operate as the source follower since the control voltage VP is pulled up to the voltage level VGS4 from the ground voltage level. During the phase 520, when the control signals GTX, GRST and RST are high and the control signal TX is low, the reference signal may be transmitted to the output terminal VO1 through the transistor M2 and the source follower, to reset voltage levels of the FD nodes FDC, FD31 and FD32, and when the control signal GRST turns to low, the reference signal may be stored on the FD node FD32. During a phase 530, when the control signals GTX and TX are high and the control signals GRST and RST are low, the photodiode signal may be transmitted to the output terminal and the FD node FD31 through the transistor M1, the source follower and the transistor M35, and when the control signal GTX turns to low, the photodiode signal may be stored on the FD node FD31. During a phase 540, the pixel circuit 30 is waiting for being selected to perform the read out operation. During phases 545, 550 and 560, the control signal SEL turns to high, which indicates the pixel circuit 30 is selected for performing the read out operation.

During the phase 545, when the control signal RST is high and the control signals GTX, GRST and TX are low, the FD node FDC may be reset to the reference voltage level since the control voltage VP is pulled up to the voltage level VGS4 from the ground voltage level, and when the control signal GR and the control voltage VP are pulled down to the ground voltage, the source follower may be disabled. During the phase 550, when the control signal GRST is high and the control signal GTX is low, the reference signal stored on the FD node FD32 may be transmitted to the FD node FDC, and the output circuit 160 may generate the reference output signal on the output terminal VO2 according to a first voltage level (which may represent the reference signal) of the FD node FDC. During the phase 560, when the control signal GTX is high and the control signal GRST is low, the photodiode signal stored on the FD node FD31 may be transmitted to the FD node FDC, and therefore the output circuit 160 may generate the photodiode output signal on the output terminal VO2 according to a second voltage level (which may represent the photodiode signal) of the FD node FDC.

Similar to the embodiments shown in FIG. 1 and FIG. 2, the photodiode signal and the reference signal stored in the signal storage circuit 340 (i.e. the FD nodes FD31 and FD32) are pulled up from original voltage levels to other voltage levels higher than the original voltage levels according to the voltage increment $\Delta V$ applied to the control voltage VCTRL. More particularly, the voltage increment $\Delta V$ should be greater than the threshold voltage of the transistor M7 (or the transistor M3), to ensure that the transistor M7 may be tuned on. The advantages regarding this operation are similar to that of the previous embodiments. Similar descriptions of this embodiment are omitted, for brevity.

Please refer to FIG. 5 in conjunction with FIG. 4. The pixel circuit 40 is similar to the pixel circuit 30 in architecture and operations. Comparing with the pixel circuit 30, the pixel circuit 40 may further comprise the transistor M9, in order to determine whether to enable a source follower that comprises the transistor M3, M4, and M9. According to previous embodiments, those skilled in the art should understand detailed operations of the pixel circuit 40 in this embodiment, and related descriptions are omitted, for brevity.

Figure 6:
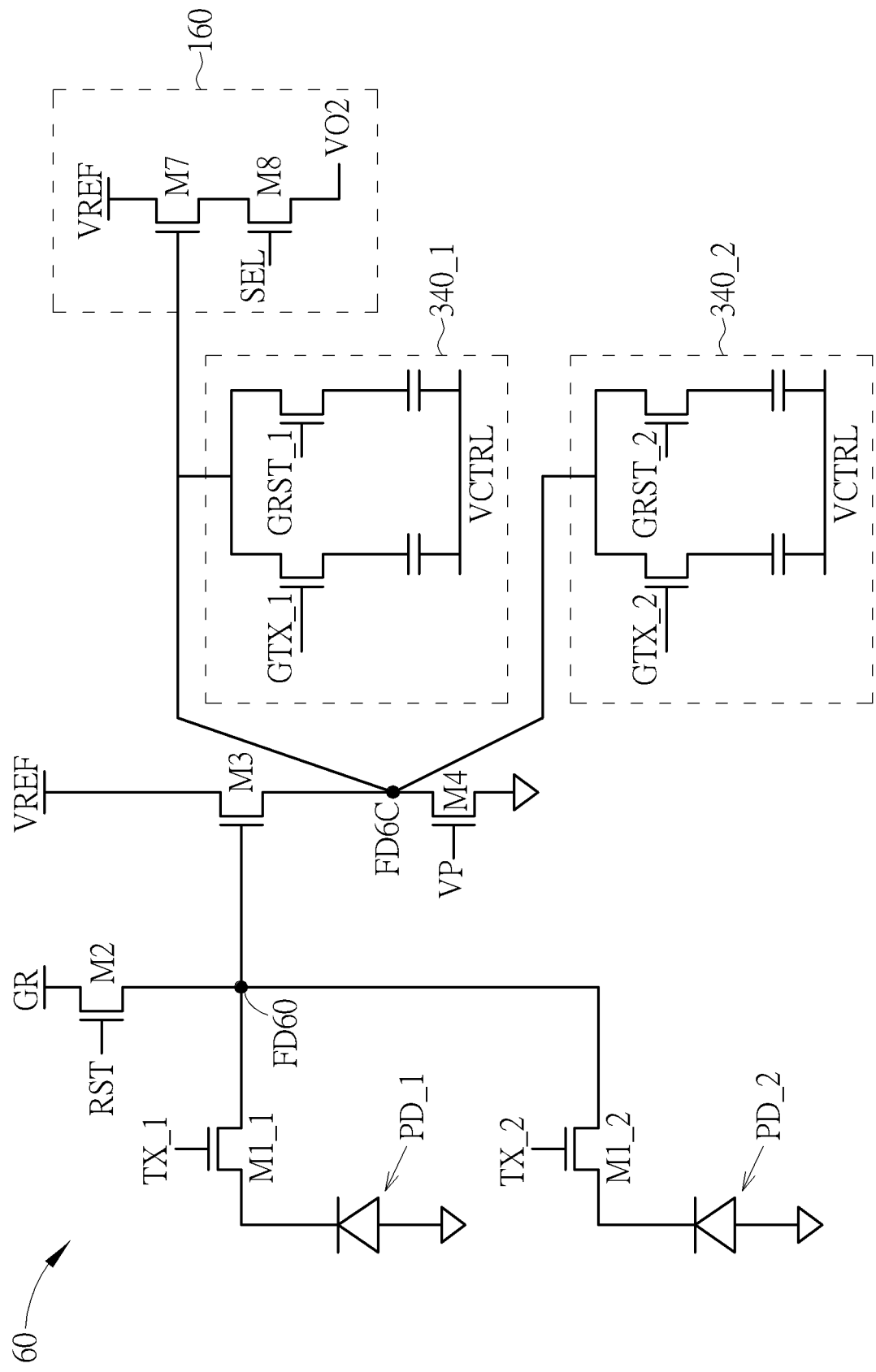
FIG. 6 is a diagram illustrating a shared pixel circuit according to an embodiment of the present invention.

In some embodiments, the FD node FD0, the transistors M2, M3, and M4, the FD node FDC and the output circuit 160 in FIG. 3 may be shared with one or more nearby pixel circuits such as that corresponding to one or more nearby pixel units within the plurality of pixel units. FIG. 6 is a diagram illustrating a shared pixel circuit 60 according to an embodiment of the present invention. In this embodiment, the shared pixel circuit 60 may comprise two pixel circuits, where one of these two pixel circuits may comprise a photodiode PD_1, a transistor M1_1, the transistors M2, M3, and M4, a signal storage circuit 340_1 (which is similar to the signal storage circuit 340) and the output circuit 160, and another one of these two pixel circuits may comprise a photodiode PD_2, a transistor M1_2, the transistors M2, M3, and M4, a signal storage circuit 340_2 (which is similar to the signal storage circuit 340) and the output circuit 160. Both of these two pixel circuits within the shared pixel circuit 60 may be taken as examples of the pixel circuit 30 shown in FIG. 3. In other words, these two pixel circuits may share an FD node FD60, the transistors M2, M3, and M4, an FD node FD6C and the output circuit 160. In other embodiments, the shared pixel circuit 60 may comprise three or more pixel circuits, any two of which are similar to each other, where these three or more pixel circuits may share the FD node FD60, the transistors M2, M3, and M4, the FD node FD6C and the output circuit 160, but the present invention is not limited thereto. After reading the descriptions of the previous embodiments, those skilled in the art should understand the associated operations of the control signals TX_1, TX2, GTX_1, GTX_2, GRST_1, GRST_2, RST, GR and SEL and the control voltages VCTRL and VP of the shared pixel circuit 60. For brevity, similar descriptions for these embodiments are not repeated in detail here.

Figure 7:
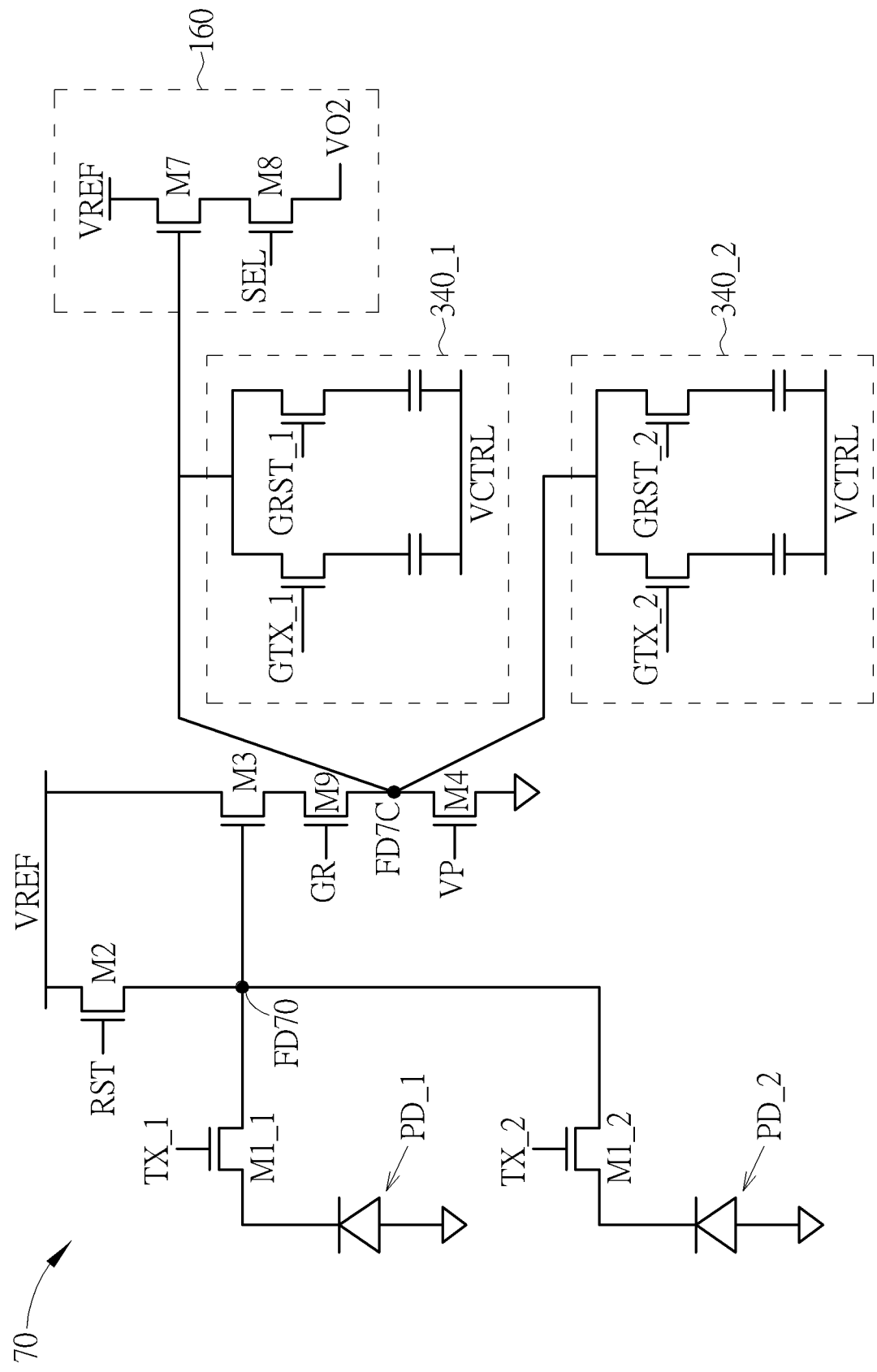
FIG. 7 is a diagram illustrating a shared pixel circuit according to an embodiment of the present invention.

In some embodiments, the FD node FD0, the transistors M2, M3, M4, and M9, the FD node FDC and the output circuit 160 in FIG. 4 may be shared with one or more nearby pixel circuits such as that corresponding to one or more nearby pixel units within the plurality of pixel units. FIG. 7 is a diagram illustrating a shared pixel circuit 70 according to an embodiment of the present invention. In this embodiment, the shared pixel circuit 70 may comprise two pixel circuits, where one of these two pixel circuits may comprise the photodiode PD_1, the transistor M1_1, the transistors M2, M3, M4, and M9, the signal storage circuit 340_1 and the output circuit 160, and another one of these two pixel circuits may comprise the photodiode PD_2, the transistor M1_2, the transistors M2, M3, M4, and M9, the signal storage circuit 340_2 and the output circuit 160. Both of these two pixel circuits within the shared pixel circuit 70 may be taken as examples of the pixel circuit 40 shown in FIG. 4. In other words, these two pixel circuits may share an FD node FD70, the transistors M2, M3, M4, and M9, an FD node FD7C and the output circuit 160. In other embodiments, the shared pixel circuit 60 may comprise three or more pixel circuits, any two of which are similar to each other, where these three or more pixel circuits may share the FD node FD70, the transistors M2, M3, M4, and M9, the FD node FD7C and the output circuit 160, but the present invention is not limited thereto. After reading the descriptions of the previous embodiments, those skilled in the art should understand the associated operations of the control signals TX_1, TX2, GTX_1, GTX_2, GRST_1, GRST_2, RST, GR and SEL and the control voltages VCTRL and VP of the shared pixel circuit 70. For brevity, similar descriptions for these embodiments are not repeated in detail here.

In some embodiments, there may be an additional reset circuit (e.g. a transistor) coupling to a photodiode (e.g. the photodiode PD, PD_1, or PD_2) within a pixel circuit, in order to reset the photodiode, but the present invention is not limited thereto.

According to some embodiments, one or more additional components, such as a transistor, may be coupled between the output terminal VO2 and the ground voltage of the architecture shown in any of FIGS. 1, 3-4, and 6-7, in order to provide the output circuit 160 with a bias current, but the present invention is not limited thereto.

To summarize, the present invention architecture provides a novel architecture of the pixel circuit that is applicable to the global shutter image sensor. The main advantage of the present invention pixel circuit is that the voltage drop(s) caused by buffer stage (s) therein can be compensated through a voltage level increment applied to the pixel signals being read out. As a result, the present invention can solve the related art problems without introducing any side effect or in a way that is less likely to introduce a side effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A pixel circuit, comprising:
  a front-end circuit, arranged to generate pixel signals, wherein the pixel signals comprise a photodiode signal and a reference signal;
  a signal storage circuit, coupled to the front-end circuit, arranged to store the photodiode signal and the reference signal generated by the front-end circuit, wherein when the pixel circuit is selected for performing a read-out operation, the photodiode signal and the reference signal stored in the signal storage circuit are pulled up from original voltage levels to other voltage levels higher than the original voltage levels according to a voltage increment applied to a control voltage; and
  an output circuit, coupled to the signal storage circuit, wherein when the pixel circuit is selected for performing the read-out operation, the output circuit generates output signals on an output terminal according to the other voltage levels, respectively.

2. The pixel circuit of claim 1, wherein the signal storage circuit comprises:
  a first transistor, coupled between the front-end circuit and a first floating diffusion (FD) node, wherein a gate terminal of the first transistor is coupled to a first control signal;
  a second transistor, coupled between the first FD node and a second FD node, wherein a gate terminal of the second transistor is coupled to a second control signal;
  a first capacitor, coupled between the first FD node and the control voltage; and
  a second capacitor, coupled between the second FD node and the control voltage;
  wherein the first FD node and the second FD node are arranged to store the photodiode signal and the reference signal, respectively.

3. The pixel circuit of claim 1, wherein the output circuit comprises:

a first transistor, wherein a gate terminal and a drain terminal of the first transistor are coupled to the signal storage circuit and a first reference voltage, respectively; and a second transistor, coupled between a source terminal of the first transistor and the output terminal, wherein a gate terminal of the second transistor is coupled to a control signal.

4. The pixel circuit of claim 3, wherein the voltage increment is greater than a threshold voltage of the first transistor.

5. The pixel circuit of claim 1, wherein the front-end circuit comprises:

a photodiode, arranged to accumulate charges in response to incident radiation, to generate the photodiode signal;

a first transistor, coupled between the photodiode and an ordinary FD node, wherein a gate terminal of the first transistor is coupled to a first control signal;

a second transistor, coupled between a first reference voltage and the ordinary FD node, wherein a gate terminal of the second transistor is coupled to a second control signal;

a third transistor, wherein a gate terminal, a drain terminal and a source terminal of the third transistor are coupled to the ordinary FD node, the first reference voltage and the signal storage circuit, respectively; and a fourth transistor, coupled between the source terminal of the third transistor and a second reference voltage, wherein a gate terminal of the fourth transistor is coupled to a gate bias voltage.

6. The pixel circuit of claim 5, wherein the voltage increment is greater than a threshold voltage of the third transistor.

* * * * *